United States Patent
Müller et al.

(10) Patent No.: US 7,509,558 B2
(45) Date of Patent: Mar. 24, 2009

(54) ERROR CORRECTION METHOD FOR REED-SOLOMON PRODUCT CODE

(75) Inventors: Stefan Müller, Villingen-Schwenningen (DE); Marten Kabutz, Villingen-Schwenningen (DE); Xavier Lebegue, Jouy-en-Josas (FR)

(73) Assignee: Thomson Licensing, Boulogne-Billancourt (FR)

( * ) Notice: Subject to any disclaimer, the term of this patent is extended or adjusted under 35 U.S.C. 154(b) by 222 days.

(21) Appl. No.: 10/563,717

(22) PCT Filed: Jul. 1, 2004

(86) PCT No.: PCT/EP2004/007158

§ 371 (c)(1),
(2), (4) Date: Jan. 6, 2006

(87) PCT Pub. No.: WO2005/006563

PCT Pub. Date: Jan. 20, 2005

(65) Prior Publication Data

US 2006/0195757 A1    Aug. 31, 2006

(30) Foreign Application Priority Data

Jul. 9, 2003    (EP) .................................. 03291705

(51) Int. Cl.
*H03M 13/00*    (2006.01)

(52) U.S. Cl. .................. 714/756; 714/769; 714/784; 714/754

(58) Field of Classification Search .................. 714/756, 714/112, 769, 784, 748, 754; 711/114; 370/469
See application file for complete search history.

(56) References Cited

U.S. PATENT DOCUMENTS

| | | | | |
|---|---|---|---|---|
| 5,691,994 | A * | 11/1997 | Acosta et al. | 714/784 |
| 5,812,564 | A * | 9/1998 | Bonke et al. | 714/769 |
| 6,032,283 | A | 2/2000 | Meyer | |
| 6,499,082 | B1 * | 12/2002 | Lin et al. | 711/112 |
| 6,526,477 | B1 * | 2/2003 | Yuan et al. | 711/114 |
| 6,963,586 | B2 * | 11/2005 | Henriksson et al. | 370/469 |
| 2002/0099996 | A1 | 7/2002 | Demura et al. | |
| 2003/0212830 | A1 * | 11/2003 | Greenblat et al. | 709/251 |

FOREIGN PATENT DOCUMENTS

EP    1104114    5/2001

OTHER PUBLICATIONS

Search Report dated Dec. 8, 2004.

* cited by examiner

*Primary Examiner*—Esaw T Abraham
*Assistant Examiner*—Fritz Alphonse
(74) *Attorney, Agent, or Firm*—Robert D. Shedd; Paul P. Kiel; Guy H. Eriksen

(57) ABSTRACT

A method and apparatus for error correction of an encoded data stream. A demodulated data stream is saved in an input buffer. A first correction process is performed on-the-fly in the input buffer. The data is transferred to an external SDRAM after correction. A data frame is copied from the external SDRAM to an embedded SRAM. A multipass correction is started in the embedded SRAM. The corrected data frame is copied back from the embedded SRAM to the external SDRAM.

9 Claims, 3 Drawing Sheets

ERROR CORRECTION METHOD FOR REED-SOLOMON PRODUCT CODE

The present invention relates to soft-decision decoding of Reed-Solomon product codes. It further relates to a system for correcting errors in a Reed-Solomon product code.

For optical recording media such as digital versatile disks (DVD) a Reed-Solomon (RS) product code is used for error correction. The data frames stored on the recording medium include horizontal and vertical parity data for correcting errors in the frame per rows and columns. The data rows and columns of the frame constitute so-called product-codes. In the case of a DVD, the outer code is an RS code (208,192,17), while the inner code is an RS code (182,172,11). Therefore, in this case one data frame consists of 208*182=37856 bytes.

Multipass devices save at least two data frames in a memory. One data frame is saved for input/output and the second is saved for correction. Current systems save the data either in an external SDRAM (Synchronous Dynamic Random Access Memory) or in an internal SRAM (Static Random Access Memory). Due to random accesses during correction of the errors, the SDRAM approach is significantly slower than the approach using internal SRAM.

U.S. Pat. No. 6,032,283 discloses an implementation of a DVD controller. The input/output streaming and correction is done in an external SDRAM. For fast processing an internal SRAM is used. Syndromes are saved in the internal SRAM, while correction is done in the external SDRAM. During correction the orthogonal syndromes are updated with error values. Therefore, additional hardware is required, but the process is accelerated. The disclosed implementation has a disadvantage that random accesses to the SDRAM are required, which slow down the correction. The internal SRAM consumption for multipass correction in that implementation is about 2*4992=9984 bytes.

It is an object of the invention to propose an improved method for error correction.

According to the invention, this object is achieved by a method for error correction of an encoded data stream including the steps of:
saving the demodulated data stream in an input buffer;
performing a first correction process on-the-fly in the input buffer;
transferring the data to an external DRAM after first inner correction;
copying the data from the external DRAM to an embedded SRAM;
starting a multipass correction in the embedded SRAM; and
copying the corrected data back from the embedded SRAM to the external DRAM after the multipass correction.

The method uses a mixture of external DRAM and internal SRAM. The input/output streaming is performed by a comparatively slow external DRAM, while the correction is performed in a fast internal SRAM. Therefore, the data from the external DRAM are copied into the fast internal SRAM only for correction. After the first correction process, the so-called "Inner 1", the data is streamed to the external DRAM. After gathering a full ECC block in DRAM the data is streamed to an embedded internal SRAM. The ECC block is corrected via a multipass correction in the embedded SRAM and streamed back after completion. In this way the number of random accesses to the external DRAM is reduced. If the errors are sorted, the "Inner 1" correction process and the transfer of the data can be performed at same time. Furthermore, the size of the internal SRAM is also reduced. The internal SRAM correction simplifies the hardware complexity during the correction process.

According to another aspect of the invention, a device for error correction of an encoded data stream includes:
an input buffer for saving the demodulated data stream and performing a first correction process on-the-fly;
an external DRAM to which the data are transferred after correction;
an embedded SRAM for performing a multipass correction on the corrected data;
means for copying the data frame from the external DRAM to the embedded SRAM; and
means for copying the corrected data back from the embedded SRAM to the external DRAM after the multipass correction.

Such a device, as it is an implementation of the method according to the invention, has the advantage that the required SRAM and the random accesses to the DRAM are reduced. Furthermore, due to the internal SRAM approach high multipass correction is enabled.

Favourably, the data stream includes data frames consisting of data rows and columns including horizontal and vertical parity data for correcting errors in the data frame. An example for such a data stream is a data stream which encoded with a Reed-Solomon product code. This type of error correction code is widely used for coding data streams on recording media, which makes the invention applicable to a variety of different data streams.

Advantageously, the size of the input buffer is at least twice the number of bytes per row of the data frame. This makes it possible to save the next received row of the data frame while correcting the present row of the data frame.

Favourably the input buffer is an SRAM. An SRAM allows fast random accesses to the stored data. This further increases the correction process.

Advantageously, status bits are stored in a status memory during the correction process, the status bits indicating if a row of the data frame is correct or not. These status bits are then used by a control unit for determining and starting the process for a specific codeword.

Favourably, a method or a device according to the invention is used by an apparatus for reading from and/or writing to recording media.

For a better understanding of the invention, an exemplary embodiment is specified in the following description with reference to the figures. It is understood that the invention is not limited to this exemplary embodiment and that specified features can also expediently be combined and/or modified without departing from the scope of the present invention. In the figures.

Figure 1:
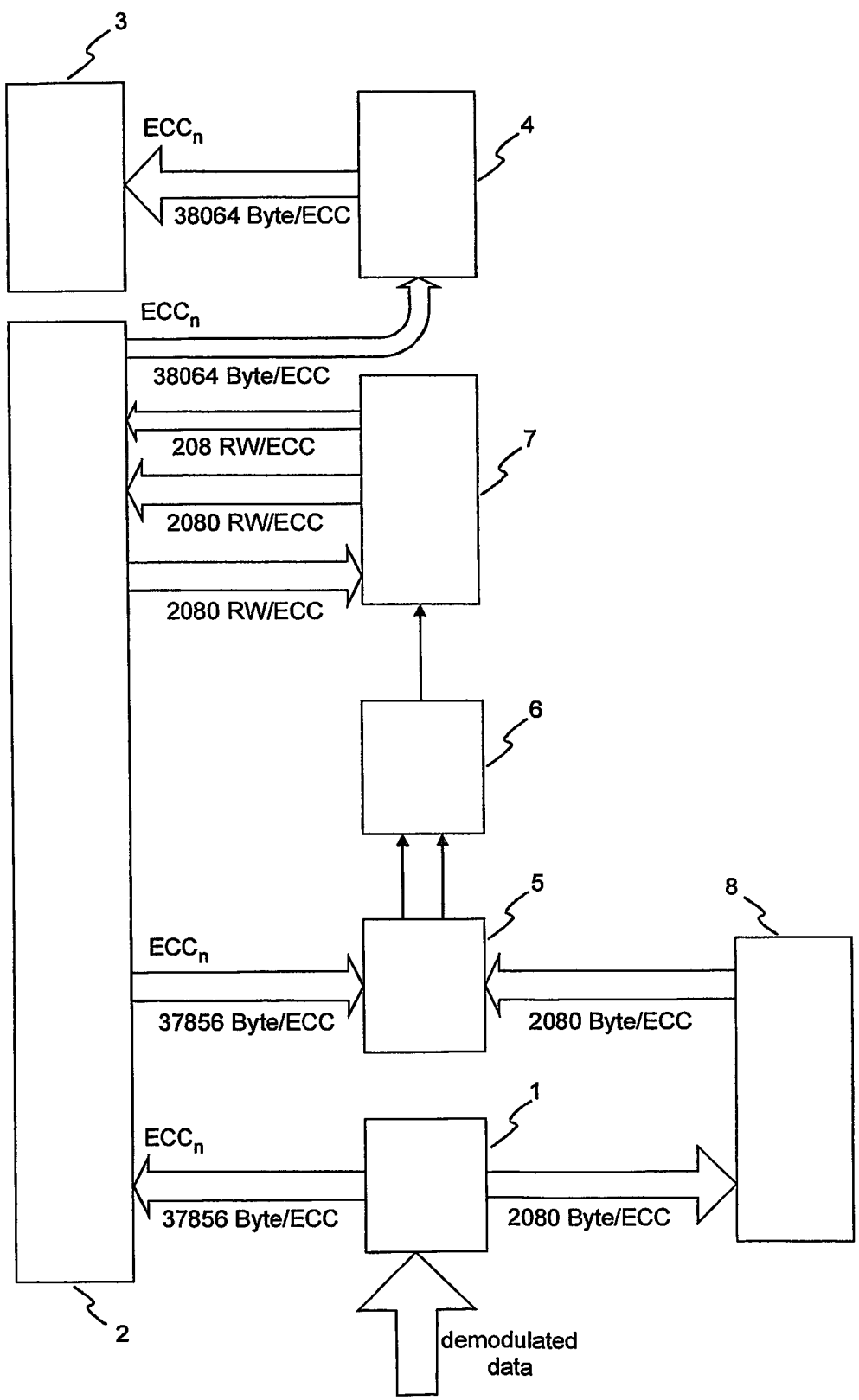
FIG. 1 shows a block diagram of data acquisition and the horizontal pass 1.

In the following the invention is explained with reference to synchronous dynamical random access memory (SDRAM). However, the invention is applicable to any kind of dynamical random access memory, e.g. double data rate RAM (DDR-RAM), enhanced synchronous DRAM (ES-DRAM), synchronous link DRAM (SLDRAM), Rambus DRAM (RDRAM), etc. Furthermore, reference is made to optical systems used for digital versatile disks. Of course, the invention is also applicable to other types of disk systems and also other applications using similarly encoded data streams.

On a DVD the input data are packed in interleaved ECC blocks. An error correction code (ECC) block comprises 208 rows times 182 columns of symbols, whereby one symbol corresponds to one byte.

For decoding a DVD data frame the following procedures are performed:

Inputting and sorting the data according to the frame numbers

Deinterleaving the ECC block

Correcting the ECC block horizontally (PI-correction; inner correction)

Correct the ECC block vertically (PO-correction; outer correction)

Multipass: Performing horizontal and vertical correction again, if necessary

Descrambling the data frame

Performing an EDC (error detection code) check on the data frame

Two types of corrections are performed during the data flow:

Horizontal: correcting 208 rows with (182,172,11) RS codes

Vertical: correcting 182 columns with (208,192,17) RS codes

According to the invention an input buffer 2 and one SRAM bank 11 holding the data for one ECC block are used. The first correction pass, the so-called "inner1" correction, is done on-the-fly, while the multipass correction is done in the embedded SRAM bank 11. A brief description of the dataflow during the two correction processes is given in the following. For the first correction process, the demodulated data stream of a block $ECC_n$ is saved in a small embedded SRAM1 2, referred to as "input buffer". The correction of the block $ECC_n$ is performed on-the-fly in the embedded SRAM1 2. After correction of inner1 the data of the block $ECC_n$ are transferred to an external SDRAM 3 and a status bit for the next orthogonal pass is set in the status memory 12.

For the second correction process, after receiving a full block $ECC_n$ in the external SDRAM 3 the multipass corrected data of a previous block $ECC_{n-1}$ is read out from the embedded SRAM2 11 back to the external SDRAM 3 while the block $ECC_n$ is copied from the SDRAM 3 to the SRAM2 11. During copying of data the status memory 12 is read and the erasure positions are calculated. After receiving a full block $ECC_n$ in the embedded SRAM2 11, the multipass correction is started. Both processes acquisition and multipasses are working independently from each other.

In FIG. 1 a block diagram of acquisition and the horizontal pass 1 is shown. An input controller 1 saves one row of the block $ECC_n$ in the input buffer 2. The size of the input buffer 2 favourably is at least twice the number of bytes per row in order to allow to save the next received row while correcting the present row. The input controller 1 detects streaming discontinuities. Any discontinuities of less than one row (byte/frame) are handled immediately in the input buffer 2. If streaming discontinuities of one row or more are detected, this information is stored and the row is written to the correct position of the SDRAM 3 by a deinterleaver 4. After completing one row, the input controller 1 starts a horizontal syndromes unit 5. The horizontal syndromes unit 5 reads the row from the input buffer 2 and computes modified syndromes and an erasure polynomial. A key solver and Chien unit 6 solves the equation and transfers the error values and positions to a correction unit 7. The positions of the first ten acquisition errors are stored in a first erasure memory 8. The correction unit 7 corrects the data of the block $ECC_n$ in the input buffer 2 in a bytewise access row by row. If a row is uncorrectable, the row number is marked as uncorrectable. Therefore, a status bit is attached to the row, indicating if the obtained codeword is correct or not. After correction of one row, the row is transferred to the external SDRAM 3 via the deinterleaver 4, taking into account the row number information from the input controller 1. If necessary, the deinterleaver 4 jumps row-wise in the SDRAM 3 to correct streaming discontinuities detected by the input controller 1. After acquisition of the complete block $ECC_n$, the second process of multipass correction is initiated. The uncorrectables are then used as erasures for the next orthogonal process.

Figure 2:
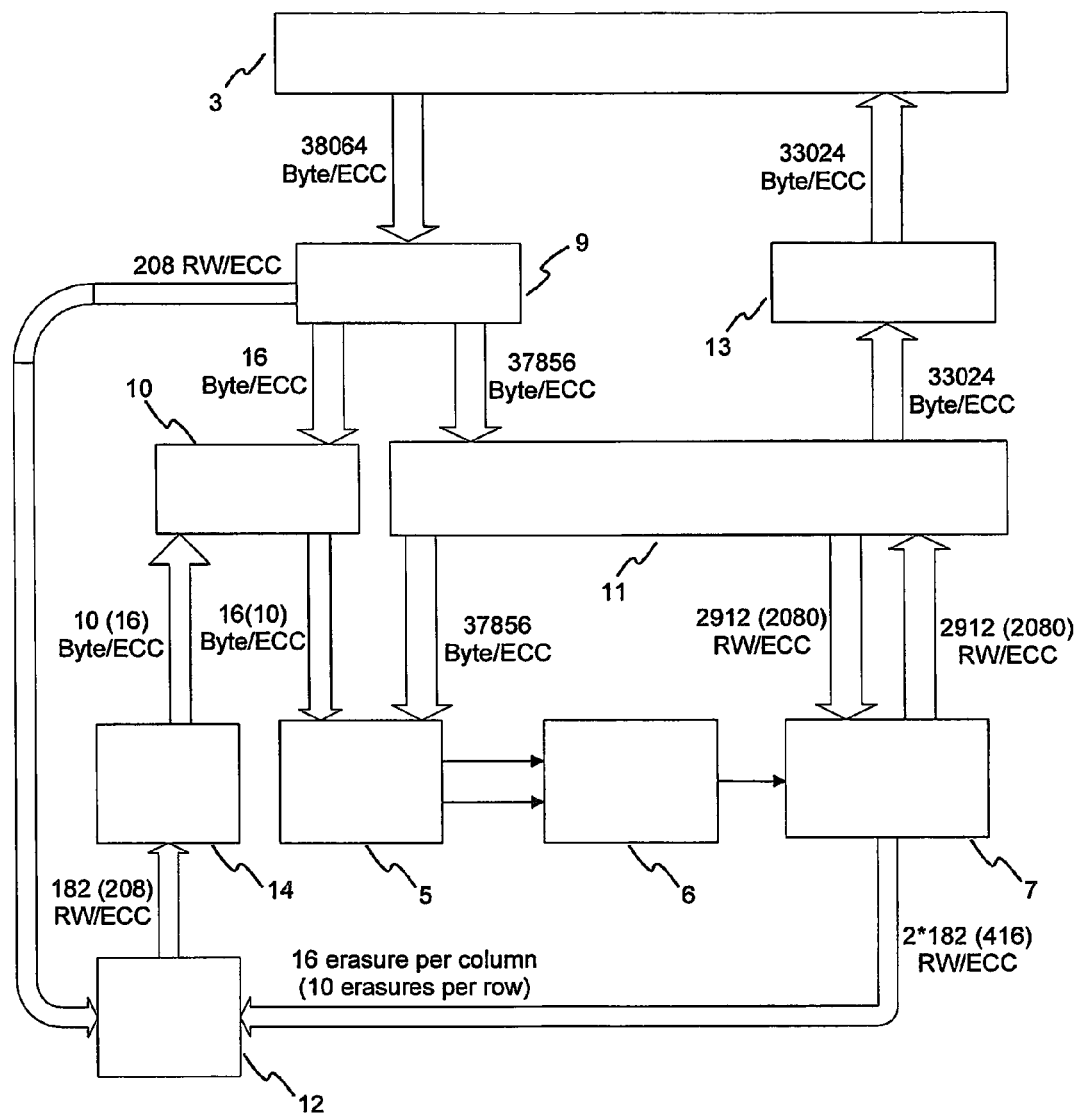
FIG. 2 shows the process flow of the multipass correction.

After receiving one full block $ECC_n$ in the SDRAM 3, the data are copied to the SRAM2 11. While the next block $ECC_{n+1}$ is streamed through the SRAM1 2, the vertical and subsequently the multipass correction is performed in the embedded SRAM2 11. The process flow of the multipass correction is shown in FIG. 2. In the figure, in case a pair of numbers is given, the numbers in brackets refer to horizontal correction, while the numbers without brackets refer to vertical correction. A copy unit 9 copies the data of the block $ECC_n$ into the embedded SRAM2 11. It further maps the above mentioned status bits into the status memory 12 of the "Inner1" pass and computes the erasure positions of uncorrectable errors, which are written into a second erasure memory 10. The second erasure memory 10 stores the positions of up to 16 rows/10 columns, which were uncorrectable in the previous correction process. After receiving the full block $ECC_n$, a control unit 14 is started. The control unit 14 reads the last written status of the codeword from the status memory 12. According to this status the process for the codeword is started. The syndrome generator 5 reads the erasure of the last orthogonal process and computes the syndromes of the codeword. After computation of the syndromes, it starts the key solver and Chien 6 search algorithm with the syndromes and the last orthogonal erasure positions. The correction unit 7 corrects the ECC block in the SRAM2 11 in a bytewise access, saving the status of the codeword back into the status memory 12. An output/descrambler 13 descrambles the data stream, performs an error detection code check, and copies the data back to a DRAM track buffer area. The output/descrambler 13 may further Perform a sector filtering.

The memory needed for the process flow can be summarized as follows:

Erasure Memory1, 10 bytes per row of SRAM1

Status Memory, 390 bit=49 bytes

Erasure Memory2, 16 bytes

SRAM1<4 kbyte

SRAM2 37856 bytes

Figure 3:
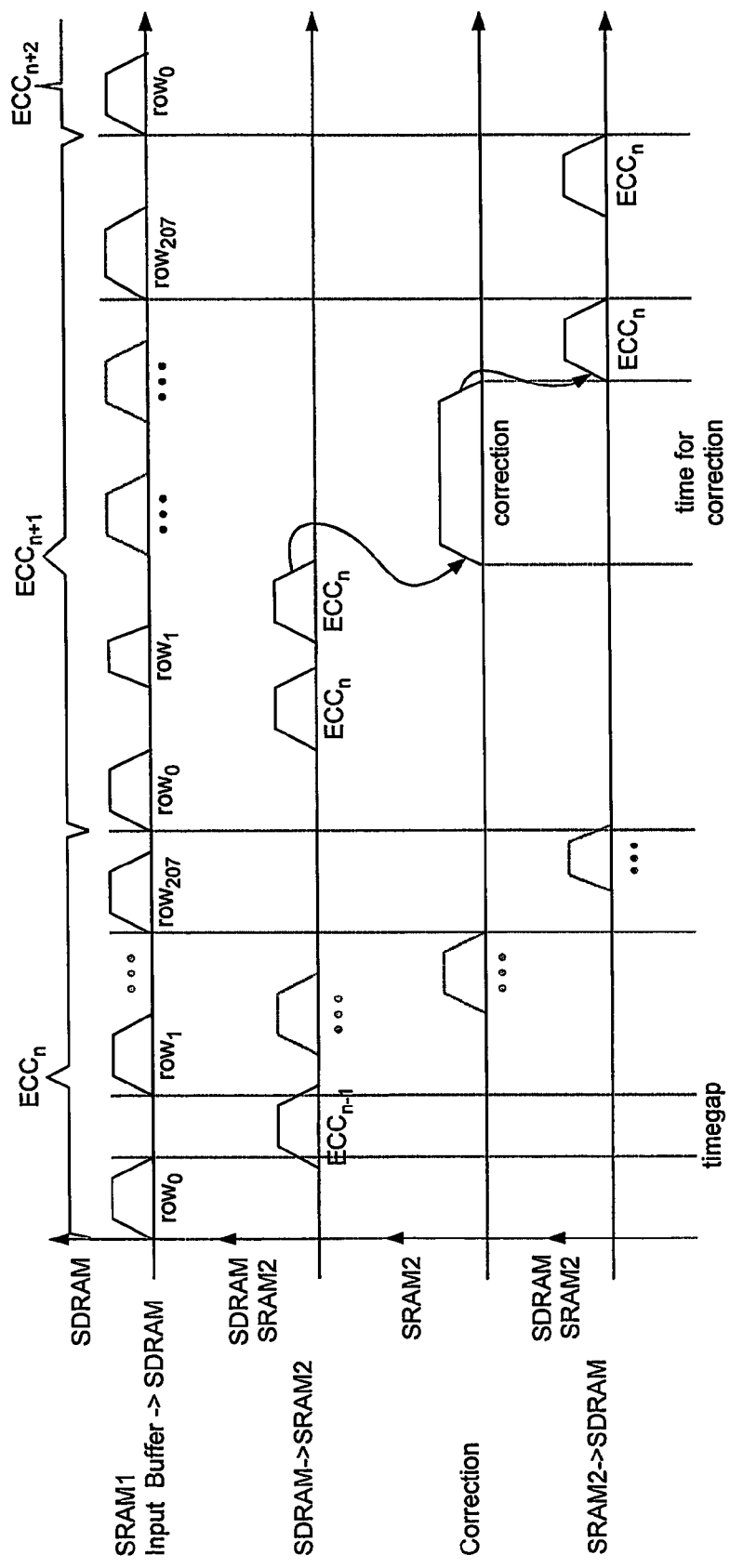
FIG. 3 shows the data flow timing of SRAM2/SDRAM.

FIG. 3 shows a more detailed timing structure of the SRAM behaviour. The streams between SRAM and SDRAM reduce the time left for multipass correction. From the figure it can be seen that the two processes described in FIG. 1 and FIG. 2 are decoupled. The stream from the input buffer 2 to the SDRAM 3 is critically temporally linked to the data input, whereas the streams from the SDRAM 3 to the SRAM2 11 and from the SRAM2 11 to the SDRAM 3 can be transmitted discretionarily whenever the bus to the SDRAM 3 is empty. This only depends on the speed of the SDRAM buffer.

The invention claimed is:

1. Method for error correction of an encoded data stream including the steps of:

saving the demodulated data stream in an input buffer;

performing a first correction process on-the-fly in the input buffer;

transferring the data to an external DRAM after correction;

copying the data from the external DRAM to an embedded SRAM;

starting a multipass correction in the embedded SRAM;

copying the corrected data back from the embedded SRAM to the external DRAM after the multipass correction; and deinterleaving and/or correcting streaming discontinuities in the external DRAM.

2. Method according to claim 1, wherein streaming discontinuities of less than one row are corrected immediately in the input buffer while streaming discontinuities of one row or more are corrected in the external DRAM.

3. Method according to claim 1, further including the step of using the external DRAM for deinterleaving.

4. Method according to claim 1, wherein the data stream includes data frames consisting of data rows and columns including horizontal and vertical parity data for correcting errors in the data frame.

5. Method according to claim 1, wherein the size of the input buffer is at least twice the number of bytes per row of the data frame.

6. Method according to claim 1, wherein the input buffer is an SRAM.

7. Method according to claim 1, further including the step of storing status bits in a status memory, the status bits indicating if a row of the data frame is correct or not.

8. Device for error correction of an encoded data stream, including:

an input buffer for saving the demodulated data stream and performing a first correction process on-the-fly;

an external DRAM to which the data are transferred after correction;

an embedded SRAM for performing a multipass correction on the corrected data;

means for copying the data frame from the external DRAM to the embedded SRAM;

means for copying the corrected data back from the embedded SRAM to the external DRAM after the multipass correction; and a deinterleaver for deinterleaving and/or for correcting streaming discontinuities in the external DRAM.

9. Apparatus for reading from a recording media and writing to a recording media, wherein said apparatus includes means for performing a method-according to claim 1.

* * * * *